United States Patent
Doege

(10) Patent No.: US 10,759,291 B2
(45) Date of Patent: Sep. 1, 2020

(54) SYSTEM AND A METHOD FOR UNLOCKING A CHARGING PLUG INSERTED IN A VEHICLE CHARGING SOCKET

(71) Applicant: AUDI AG, Ingolstadt (DE)

(72) Inventor: Carsten Doege, Torgau (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 16/440,044

(22) Filed: Jun. 13, 2019

(65) Prior Publication Data

US 2020/0009973 A1 Jan. 9, 2020

(30) Foreign Application Priority Data

Jul. 5, 2018 (DE) .......................... 10 2018 211 130

(51) Int. Cl.
| | |
|---|---|
| *G08B 13/14* | (2006.01) |
| *B60L 53/16* | (2019.01) |
| *H03K 17/96* | (2006.01) |
| *G07C 9/00* | (2020.01) |
| *H01R 13/639* | (2006.01) |

(52) U.S. Cl.
CPC .......... *B60L 53/16* (2019.02); *G07C 9/00182* (2013.01); *G07C 9/00563* (2013.01); *H01R 13/6397* (2013.01); *H03K 17/962* (2013.01)

(58) Field of Classification Search
CPC . B60L 53/16; G07C 9/00563; G07C 9/00182; H01R 13/6397; H03K 17/962
USPC ....................................................... 340/572.1
See application file for complete search history.

(56) References Cited

U.S. PATENT DOCUMENTS

| | | | | |
|---|---|---|---|---|
| 2013/0160086 A1* | 6/2013 | Katar | .................. | H04L 63/0892 726/4 |
| 2015/0239357 A1* | 8/2015 | Huntzicker | ........... | H04L 63/062 701/22 |
| 2015/0329002 A1* | 11/2015 | Broecker | ................ | B60L 53/62 320/109 |
| 2016/0257211 A1* | 9/2016 | Kimura | ................. | B60L 53/305 |

(Continued)

FOREIGN PATENT DOCUMENTS

| | | |
|---|---|---|
| DE | 102011000094 A1 | 7/2012 |
| DE | 102012202368 A1 | 8/2013 |
| DE | 102012021518 A1 | 5/2014 |

(Continued)

OTHER PUBLICATIONS

German Search Report dated Mar. 28, 2019 in corresponding German Application No. 10 2018 211 130.8; 20 pages.

*Primary Examiner* — Tanmay K Shah
(74) *Attorney, Agent, or Firm* — Maier & Maier, PLLC

(57) ABSTRACT

A system for unlocking a charging plug inserted in a charging socket of a vehicle, a sensor device, which, when the charging plug is inserted in the charging socket of the vehicle, is designed to detect a person's hand when gripping a handle of the charging plug; a control device designed to check whether the vehicle is unlocked and/or the person is authorized to enter the vehicle, when the hand is detected, and unlock the charging plug inserted into the charging socket, if at least one of the two conditions has been successfully checked. Furthermore, the invention relates to a method for unlocking a charging plug inserted in a charging socket of a vehicle.

7 Claims, 1 Drawing Sheet

(56) References Cited

U.S. PATENT DOCUMENTS

2019/0027867 A1* 1/2019 Ognjanovski ......... H02J 7/0045
2019/0371176 A1* 12/2019 Montemurro ..... H04W 12/0027

FOREIGN PATENT DOCUMENTS

| DE | 102013112991 A1 | 6/2015 |
| DE | 102018120358 A1 | 2/2019 |

* cited by examiner

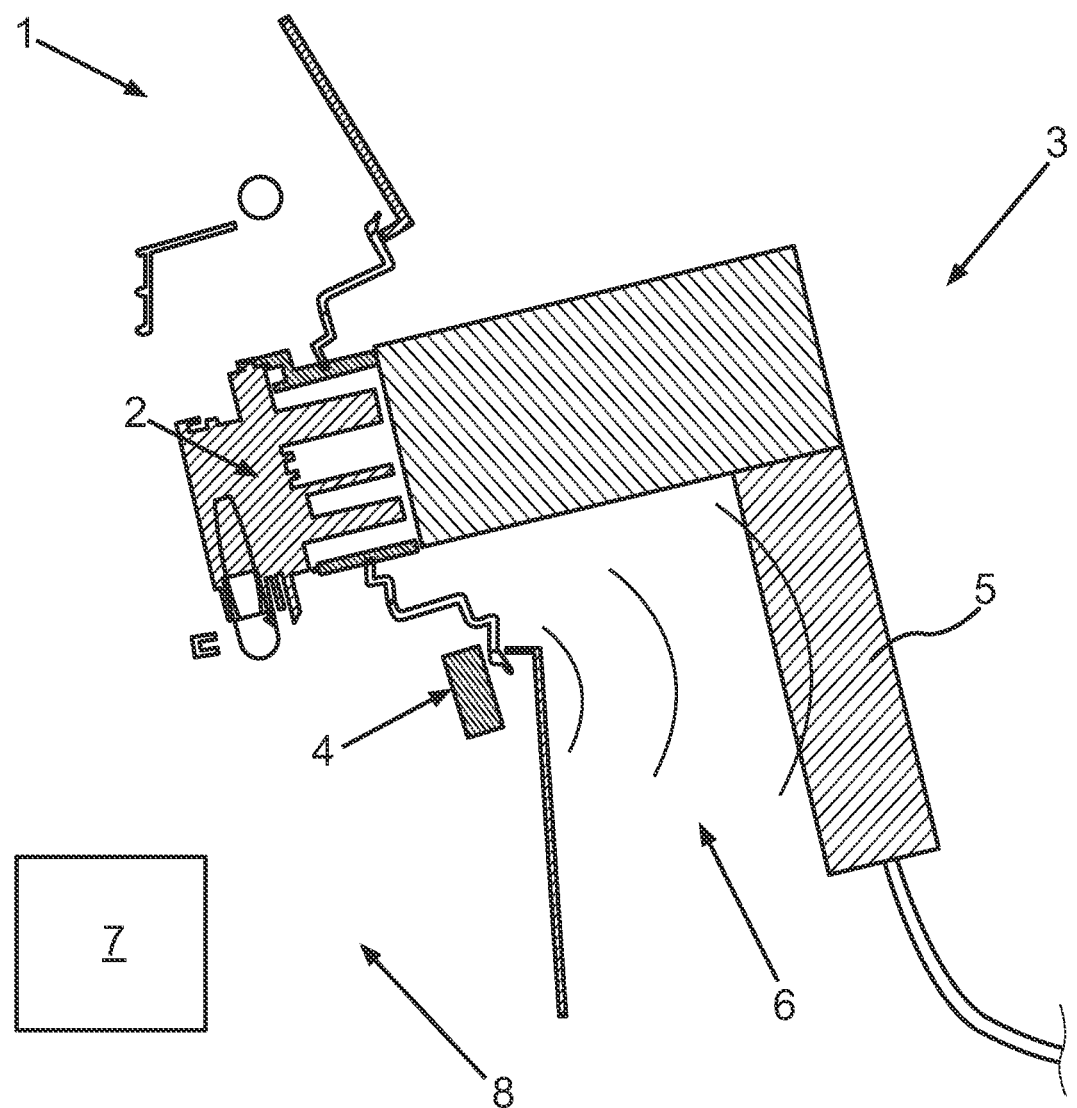

SYSTEM AND A METHOD FOR UNLOCKING A CHARGING PLUG INSERTED IN A VEHICLE CHARGING SOCKET

FIELD

The disclosure relates to a system and a method for unlocking a charging plug inserted in a charging socket of a vehicle. The disclosure, furthermore, relates to a vehicle equipped with such a system.

BACKGROUND

It is per se known that charging plugs are inserted into charging sockets of hybrid or electric vehicles in order to charge a battery of the vehicle. To ensure reliable operation of the charging process, it is common practice to lock the charging plug inserted into the vehicle charging socket in or at the charging socket. This prevents the charging plug from being accidentally disconnected during charging.

DE 10 2012 021 518 A1 discloses a method for supporting the charging process of an energy storage device in a vehicle. When a specified hand movement in the vicinity of a charging socket of the vehicle is detected, a loading flap capable of blocking access to the charging socket is opened.

DE 10 2012 202 368 A1 shows a charging device for charging an electric vehicle, having a charging plug. The charging plug comprises an unlocking button, with which the charging plug can be unlocked from the vehicle after charging by actuating the unlocking button.

DE 10 2013 112 991 A1 shows a charging plug for an electric vehicle with a locking element and a safety element. By operating the two elements, the charging plug is either locked or unlocked.

SUMMARY

The object of the present invention is to provide a solution, which simplifies operation of a charging plug that can be inserted into the charging socket of a vehicle.

This object is achieved by a system and a method for unlocking a charging plug inserted in the charging socket of a vehicle.

The system according to the invention for unlocking a charging plug inserted in a charging socket of a vehicle comprises a sensor device designed to detect a person's hand, when inserting the charging plug into the vehicle charging socket, and the person grips the charging plug handle. Thus, a detection range of the sensor device is such that the sensor device can detect a person's hand when gripping the handle of the charging plug inserted into the charging socket. The sensor device is, furthermore, arranged according to the detection range of the sensor device, such that it can reliably detect a person's hand when gripping the handle of the charging plug inserted in the charging socket The system according to the invention also includes a control unit designed to check whether the vehicle is unlocked and/or a person is authorized to enter the vehicle, when detecting their hand, and unlock the charging plug inserted in the charging socket, when at least one of the two conditions has been successfully checked. The control unit may therefore automatically operate a locking mechanism to allow for the inserted charging plug to be removed from the charging socket, once the control unit has detected that the vehicle is unlocked and/or the person gripping the handle of the charging plug is authorized to enter the vehicle.

The invention is based on the understanding that, despite the extensive use of so-called keyless entry systems, it is currently necessary to manually unlock the central locking system of vehicles in order to remove a charging plug inserted in the charging socket, e.g., by operating a corresponding radio key, before the charging plug can be removed from the charging socket. Alternatively, it may also be necessary to first open a vehicle door to remove the charging plug from the charging socket. Or, a vehicle user may have to perform an additional operation by, e.g., pressing a button in the vehicle interior, before being able to disconnect the charging plug from the charging socket.

With the system according to the invention, a user need only grip the charging plug by its handle. The system recognizes this action and unlocks the charging plug upon successful verification of the entry authorization and/or if the vehicle has already been unlocked The system according to the invention thus enables intuitive operation without the need for additional actions in order to remove the charging plug previously locked in the charging socket.

An advantageous embodiment of the invention provides for the sensor device to be integrated in the vehicle in the vicinity of the charging socket for hand-detection. Due to the arrangement of the sensor in the area of the charging socket, the sensor can reliably detect a hand gripping the handle of the charging plug. According to its detection range, the sensor is arranged in the area of the charging socket, such that it can reliably detect a hand gripping the handle of the charging plug. One advantage of the vehicle-mounted sensor is that it is always possible, independently of the charging plug, to reliably detect when a person grips the handle of the charging plug. The charging plug, itself, does not have to be equipped with a sensing device, for this purpose.

A further advantageous embodiment of the invention provides for the control unit to be designed to control a keyless entry system of the vehicle in order to check whether a person has entry authorization. Thus, the moment a hand has been detected on the handle of the charging plug, the control unit activates the keyless vehicle entry system, thereby checking whether a person has entry authorization. For example, the keyless entry system can check whether a person is carrying a transponder—e.g., integrated in a radio key—with vehicle entry authorization. It is also possible for the keyless entry system to check, e.g., whether a person is carrying a smartphone with entry authorization. Controlling the keyless entry system in this way makes it possible to check reliably whether a person currently gripping the handle of the charger plug has vehicle entry authorization. If not, it may be provided that automatic unlocking of the charging plug inserted in the charging socket will fail. Alternatively, it may also be provided that automatic unlocking of the charging plug nonetheless takes place, i.e., if it is determined that the vehicle itself was already unlocked when the handle of the charging plug was gripped For example, it is conceivable that a driver of the vehicle already is seated the vehicle during the charging process, when asking a passenger remaining outside the vehicle to pull the charging plug out of the charging socket. In this case, automatic unlocking of the charging plug may be enabled, if it is detected that the vehicle was already unlocked. It is also conceivable that the driver of the vehicle is returning from shopping, while the vehicle is being charged at a charging column at a shopping center. To charge the vehicle for a maximum period, the driver may, e.g., first unlock the vehicle to stow their purchases in the vehicle. If reaching for the charging plug, upon having already stowed the purchases, the control unit can then automatically unlock the charging plug, so that the driver can remove the charging plug, as the vehicle has already been unlocked.

According to a further advantageous embodiment of the invention, it is provided that the sensor device is designed to capacitively detect the hand gripping the handle of the charging plug. The sensor device can thus capacitively detect the approaching hand, the moment it grips the charging plug handle. This allows for detecting the hand on the charger plug in a simple and reliable manner.

A further advantageous embodiment of the invention provides for the control unit to be installed in the vehicle. This means that the vehicle automatically can unlock the charging plug inserted in the charging socket, independently of a charging column with which the vehicle is connected to by means of the charging plug, provided that at least one of the above conditions is met. Alternatively, it is also conceivable for such a control unit to be installed, e.g., in a charging column. The advantage here is that the charging column may provide for automatically unlocking of the charging plug, irrespective of the vehicle equipment. Furthermore, it is also conceivable that such a control unit could be installed both in the vehicle and the charging column. This redundancy makes the system particularly fail-safe.

In a further advantageous embodiment of the invention, the sensor device has a sensor, at the charging plug, integrated in the area of the handle of the charging plug for detecting the hand. In this case, it would also be possible to reliably detect a hand placed on the handle of the charging plug without the need for installing a corresponding sensor in the vehicle. It is also conceivable that the sensor device has two sensors, one of which is mounted on the vehicle and the other on the charging plug. This redundancy makes the system particularly fail-safe in terms of being able to detect a hand on the handle of the charging plug.

The inventive vehicle comprises the inventive system or an advantageous embodiment of the inventive system, whereby the control unit and sensor device are mounted on the vehicle.

In the method according to the invention for unlocking a charging plug inserted in a vehicle charging socket, a sensor device detects whether a person is manually gripping a handle of the charging plug. Whether the vehicle is unlocked and/or whether a person has entry authorization to the vehicle is checked, when a hand gripping the charging plug is detected, whereby the charging plug inserted in the charging socket is unlocked, when at least one of the two conditions is successfully verified. Advantageous embodiments of the system according to the invention will be considered advantageous embodiments of the inventive method and vice-versa, whereby the system comprises particular means for carrying out the steps of the method.

Further advantages, features and details of the invention will become clear from the embodiments described below, and in reference to the drawing. The features and their combinations mentioned above in the description, including the features and their combinations shown below in the description of the figure and/or in the figure per se may be used in the indicated combination, as well as in other combinations or separately, without deviating from the scope of the invention.

BRIEF DESCRIPTION OF THE DRAWING

The drawing in the only FIG. 1 schematically represents a charging plug inserted in a charging socket of a vehicle, including a vehicle-mounted sensor for detecting the person's hand the moment they grip a handle of the charging plug.

FIG. 1 a charging plug inserted into a charging socket of a vehicle, including a vehicle-mounted sensor for detecting the person's hand the moment they grip a handle of the charging plug.

A section of a vehicle 1 in the area of a vehicle-mounted charging socket is shown in the single figure. A charging plug 3 is inserted in the charging socket 2. A sensor 4 of an unspecified sensor device is located in the vicinity of the charging socket 2 and can detect the moment, when a person manipulates a handle 5 of the charging plug 3 or grips the handle 5. A schematically indicated detection range 6 of the sensor 4 is matched with the arrangement of sensor 4 and is large enough for a person's hand to be reliably detected by means of sensor 4, if the handle 5 is gripped, when the charger plug is inserted.

Furthermore, the vehicle 1 includes a control unit 7, which is designed to automatically unlock the charging plug 3 inserted in the charging socket 2 The sensor 4 of the unspecified sensor device and together with the control unit 7 form a system 8 for automatically unlocking the charging plug 3 inserted in the charging socket 2

The moment the sensor device by means of its sensor 4 detects that a person has placed their hand around the handle 5 of the charging plug 3, the sensor device signals this to the control unit 7. The control device 7 then checks whether the vehicle 1 is unlocked and/or whether the person, who has placed their hand around the handle 5 of the charging plug 3, has entry authorization to the vehicle 1. If at least one of the two conditions is successfully checked, the control unit 7 unlocks the charging plug 3 inserted in the charging socket 2. The charging plug 3 can then simply be removed from charging socket 2

The control unit 7 is designed to operate a keyless vehicle entry system for checking a person's entry authorization, when placing their hand around the handle 5. Thus, the keyless entry system can check whether, e.g., a person is carrying a matching key with a transponder containing the entry authorization. It is also possible for the keyless entry system to check whether the person placing their hand around handle 5 is carrying a smartphone providing entry authorization for the vehicle 1. If, for example, the vehicle is still unlocked and the person has entry authorization, then the control unit 7 can automatically unlock the charging plug 3, such that it can be removed from the charging socket 2. It is also conceivable that the vehicle 1 already has been unlocked, when a person places their hand around the handle 5. In this case, it may be provided that the control device 7 automatically unlocks the charging plug 3, such that it can be disconnected from the charging socket 2, irrespective of the entry authorization of the person having gripped the handle 5.

Sensor 4 may, e.g., be a capacitive sensor for detecting a hand gripping the handle 5 of charging plug 3 However, other functional principles for checking whether a person has gripped handle 5 with their hand are also possible.

It is also possible for the sensor device to have a hand-detecting sensor integrated or mounted on the charging plug in the vicinity of the handle 5 of the charging plug 3.

Thus, it would also be possible for the charging plug 3 to check whether a person manually grips the plug 5. The sensor, not shown, in the grip area is designed to transmit to the vehicle-mounted control unit 7 the information that the grip 5 has been manually gripped. This may be done, e.g., wirelessly. It is also conceivable that the data transmission could be wired via the inserted charging plug 3, and via the charging socket 2 up to the control unit 7

When inserting the charging plug 3 into the charging socket 2, a user may, e.g., be required to let go of the handle 5 for a certain amount of time, such that the charging plug 3 is locked more reliably in charging socket 2. It is also preferable that a current flow between the charging plug 3 and charging socket 2 is interrupted the moment the charging plug 3 has been unlocked. Moreover, it can also be provided that upon unlocking the charging plug 3, it is automatically relocked in the charging socket 2, provided the charging plug 3 has not been removed. For example, it can be provided that 30 seconds after unlocking the charging plug 3, it is automatically relocked in the charging socket 2, provided the charging plug 3 has not been removed for the same duration.

The system 8 and method for automatically unlocking the charging plug 3, as explained above, has the advantage that a vehicle user need only touch the charging plug 3 by the handle 5, which results in the charging plug 3 being automatically unlocked, and the user can then disconnect the charging plug 3 from the charging socket 2. The result is a particularly intuitive operation without additional manipulation in order to remove the charging plug 3 from the charging socket 2.

The invention claimed is:

1. A system for unlocking a charging plug inserted in a charging socket of a vehicle, comprising:
    a sensor device, which is designed to detect a person's hand gripping a handle of the charging plug when inserting the charging plug into the charging socket of the vehicle; and
    a control device designed to unlock the charging plug inserted in the charging socket when, simultaneously, the control system verifies through a keyless entry system of the vehicle a person's entry authorization and the sensor detects the hand.

2. The system according to claim 1, wherein the sensor device has a sensor integrated in the vehicle in the area of the charging socket for hand-detection.

3. The system according to claim 1, wherein the sensor device is designed to capacitively detect a hand gripping the handle of the charging plug.

4. The system according to claim 1, wherein the control device is installed in the vehicle.

5. The system according to claim 1, wherein the sensor device has a hand-detecting sensor integrated in the charging plug in the vicinity of the handle of the charging plug.

6. A method for unlocking a charging plug inserted in a charging socket of a vehicle, comprising the steps of:
    detecting by means of a sensor device, whether a person manually grips a handle of the charging plug; and
    checking whether a person has entry authorization to the vehicle through a keyless entry system of the vehicle,
    whereby the charging plug inserted into the charging socket is unlocked when, simultaneously, entry authorization is confirmed and the sensor detects the hand.

7. A system for unlocking a charging plug inserted in a charging socket of a vehicle, comprising:
    a sensor device, which is designed to detect a person's hand gripping a handle of the charging plug when inserting the charging plug into the charging socket of the vehicle; and
    a control device designed to unlock the charging plug inserted into the charging socket when, simultaneously, the control device verifies that the vehicle is unlocked and the sensor detects the hand.

* * * * *